United States Patent [19]

Hatada et al.

[11] Patent Number: 4,494,688
[45] Date of Patent: Jan. 22, 1985

[54] METHOD OF CONNECTING METAL LEADS WITH ELECTRODES OF SEMICONDUCTOR DEVICE AND METAL LEAD THEREFORE

[75] Inventors: Kenzo Hatada, Katano; Isamu Kitahiro, Yawata, both of Japan

[73] Assignee: Matsushita Electric Industrial Co., Ltd., Kadoma, Japan

[21] Appl. No.: 357,319

[22] Filed: Mar. 11, 1982

[30] Foreign Application Priority Data

Mar. 16, 1981 [JP] Japan ................... 56-37499

[51] Int. Cl.³ .............................................. B23K 19/00
[52] U.S. Cl. .................................. 228/180 A; 228/188
[58] Field of Search ................... 228/180 A, 188, 123, 228/153

[56] References Cited

U.S. PATENT DOCUMENTS

| | | | |
|---|---|---|---|
| 3,513,013 | 5/1970 | Willis et al. | 228/253 X |
| 3,646,670 | 3/1972 | Maeda et al. | 228/180 A X |
| 3,702,580 | 11/1972 | Gorinas et al. | 228/180 A X |
| 3,713,575 | 1/1973 | Cushman | 228/180 A X |
| 3,766,634 | 10/1973 | Babcock et al. | 228/188 |
| 3,778,530 | 12/1973 | Reimann | 228/180 A X |
| 3,781,596 | 12/1973 | Galli et al. | 228/180 A X |
| 4,000,842 | 1/1977 | Burns | 228/180 A |
| 4,032,058 | 6/1977 | Riseman | 228/188 X |
| 4,176,443 | 12/1979 | Iannuzzi et al. | 228/180 A X |
| 4,396,140 | 8/1983 | Jaffe et al. | 228/180 A X |

FOREIGN PATENT DOCUMENTS

5124965  9/1980  Japan .................................. 228/123

Primary Examiner—Kenneth J. Ramsey
Assistant Examiner—M. Jordan
Attorney, Agent, or Firm—Wenderoth, Lind & Ponack

[57] ABSTRACT

A method suitable for connecting a plurality of metal leads at the same time with electrodes of a semiconductor device. Metal leads are provided each of which has a metal bump bonded thereto. The metal of the metal bump is softer than that of the lead. Those metal leads are located above the semiconductor device so that the bumps are contacted with the electrodes and then the bumps are bonded to the electrodes by heating, whereby the metal leads are connected with the electrodes.

9 Claims, 24 Drawing Figures

METHOD OF CONNECTING METAL LEADS WITH ELECTRODES OF SEMICONDUCTOR DEVICE AND METAL LEAD THEREFORE

BACKGROUND OF THE INVENTION

This invention relates to a method of connecting metal leads with electrodes of a semiconductor device, and more particularly relates to such a method in which a plurality of leads are bonded at the same time to the semiconductor device and a metal lead therefore.

According to the recent progress in miniaturisation of electronic home-appliances and industrial equipment, it has been urgently required to make semiconductor devices such as IC, LSI, etc. small and thin. A silicon wafer on which the semiconductor devices are formed through steps of diffusion and making electrodes, is cut into a plurality of chips of unit semiconductor devices. The packaging is provided for each semiconductor device in such a way that aluminum electrodes provided at the peripheral portions of the chip can be connected with external terminals by leads for ease of handling and further the chip is protected from mechanical damage.

Among the hitherto known methods of packaging, the tape carrier method has been a excellent one. According to that method, on each electrode terminal of the semiconductor device is provided a metal multilayer called barrier metal and on the metal multilayer is provided a metal bump by electroplating. A plurality of metal leads supported on a polyimide tape are bonded at the same time to the metal bumps corresponding terminals (called lead gang bonding). This method can provide a high reliability of bonding, a small-sized, thin package and an easy manufacturing operation.

Figure 1A:
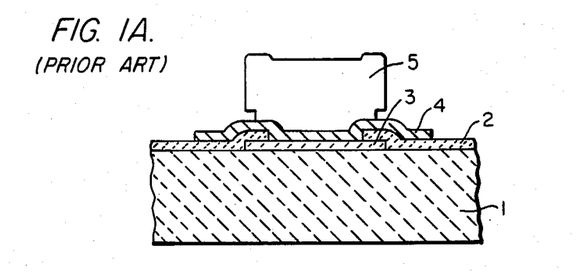
FIGS. 1A and 1B are sectional views showing a conventional tape carrier method.

It has, however, shortcomings as follows:

The metal bump in the tape carrier method has a structure as shown in FIG. 1A. In this figure, 1 denotes a semiconductor substrate with a semiconductor device formed thereon. The substrate 1 is covered with a passivation layer 2 for protecting the semiconductor device. The passivation layer 2 has an opening so as to expose an electrode terminal 3 of the semiconductor device. On that electrode terminal 3 is deposited a barrier metal 4 which is composed of a multilayer of Cr—Cu, Ti—Pa, Ni—Cu, etc. and formed by a continuous deposition in a high vacuum. In such a metal layer, Cr, Ti and Ni provide good strength of the bonding to the electrode terminal 3. On the barrier metal 4 is formed a metal bump 5. It is formed by electroplating using the barrier metal 4 as a cathode and deposited through a photoresist pattern.

Figure 1B:
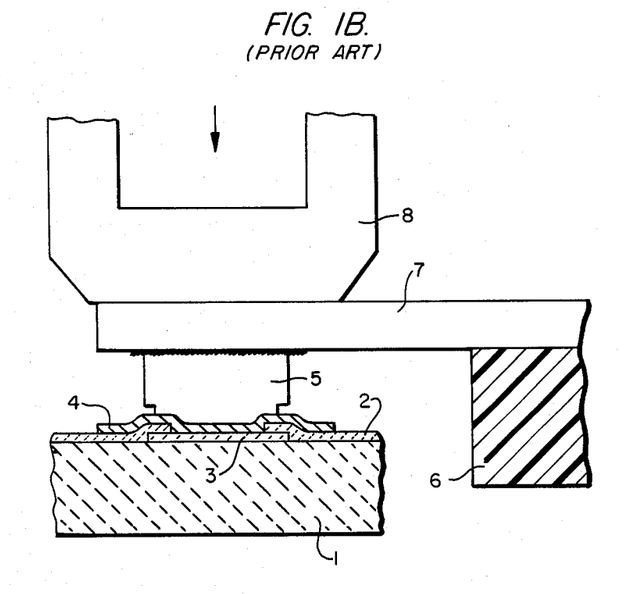

Metal leads are connected to the metal bumps as shown in FIG. 1B. Metal bumps 5 in FIG. 1B are disposed in the direction perpendicular to the sheet. A polyimide tape 6 has metal leads 7 formed thereon, being disposed along the tape in the same direction as that of the metal bumps 5. Each metal lead is laid upon a respective metal bump and they are pressed together and heated by a tool 8 so that they are bonded. If the metal bump 5 is coated with a plated Au layer and the metal lead 7 plated Sn layer, the heating causes Au—Sn eutectic alloy to be made, which gives a high bonding strength.

Such method involves problems as follows:

(1) Since the barrier metal is a multilayer, it is necessary to consider the bonding strength or barrier resistance between metal layers. If the bonding strength is low, a force applied to the metal lead easily causes peeling off between the metal layers or between the barrier metal and the bump. A large barrier resistance greatly affects the electric properties of the semiconductor device.

(2) The process for making the metal bumps requires the broad and precise techniques such as the deposition of the metal layer, plating, etching of the metal layer and photo-etching, resulting in high manufacturing cost and low yield. Further it is difficult for an ordinary assembly system to perform such process because of the necessity of high technology and expensive equipment.

(3) Dangerous and injurious chemicals are used in the process of etching the barrier metal. This makes it necessary to consider environmental protection.

(4) There is the possibility that during the bonding of the lead to the bump, the produced eutectic falls on the passivation layer 2 and the layer is cracked due to the high temperature, causing the effect thereof to be lowered. It makes the reliability of the device low.

BRIEF DESCRIPTION OF THE INVENTION

It is an object of the invention to provide a novel method of connecting metal leads with electrodes of a semiconductor device, which is easy to perform high reliability.

It is another object of the invention to provide a metal lead suitable for such method.

According to the method of this invention, metal leads each of which has a bump bonded thereto are prepared. The bump is made of a metal softer than the metal of the lead. Then the metal leads are located above corresponding electrodes of a semiconductor device so that the bumps are opposed to the electrodes, and then the bumps and the electrodes are contacted with each other and heated, whereby they are bonded together.

BRIEF DESCRIPTION OF THE DRAWINGS

FIGS. 8A to 8D are photographs illustrating the steps embodying this invention in which FIGS. 8A and 8B show areas where the metal leads and bumps are bonded together and FIGS. 8C and 8D the state where the leads are connected with the electrodes of the semiconductor device.

DETAILED DESCRIPTION OF THE INVENTION

This invention is hereinafter described in detail, referring to the embodiment shown in FIGS. 2A-2E.

Figure 2A:
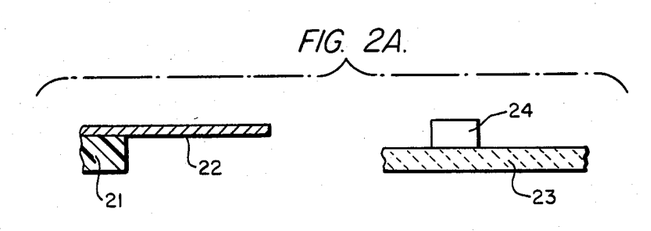
FIGS. 2A to 2E are sectional views showing the steps of connecting metal leads with electrodes of a semiconductor device according to this invention.

In FIG. 2A, 21 denotes a polyimide tape on which a plurality of metal leads 22 are formed. The metal leads 22 are disposed in a direction perpendicular to the sheet. Each of the metal leads 22 comprises, for example, Cu leades 35 $\mu$m in thickness with a Sn layer deposited in a thickness from 0.2 to 1 $\mu$m by plating, which is similar to the leads in the conventional film carrier method.

In FIG. 2A, 23 denotes a plate for supporting metal bumps 24 which are formed by electroplating and disposed in a direction similar to that of the lead 22. Of course, the intervals between the bumps are made similar to those of the metal leads 22. The metal bumps 24 are made of a metal softer than a metal of the leads 22.

Figure 2B:
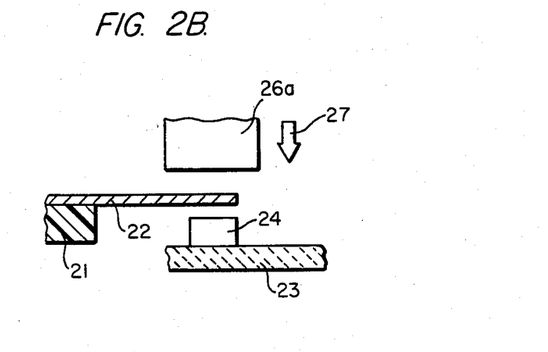

As shown in FIG. 2B, the metal leads 22 are positioned above the corresponding metal bumps 24 and are pressed onto the bumps 24, i.e. in the direction of the arrow 27, by a tool 26a. At the same time the tool 26a heats the metal leads 22 and the metal bump 24. If the metal bumps 24 are made of Au, it makes eutectic alloy together with the Sn of the metal leads 22, whereby strong bonding between the metal lead 22 and the metal bump 24 is obtained. If the bump 24 is made of Au and the lead 22 is made of Cu, the bonding depends on mutual diffusion between the metals of the lead and the bump.

Figure 2C:
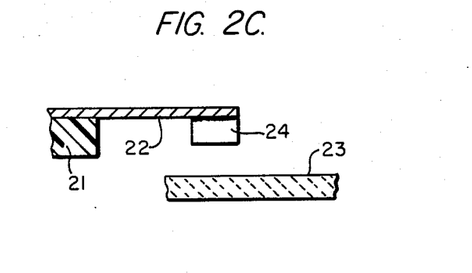

After the tool 26a is removed, as shown in FIG. 2C, the metal bumps 24 can be separated from the plate 23. Thus the metal bumps 24 are transferred to the metal leads 22.

Figure 2D:
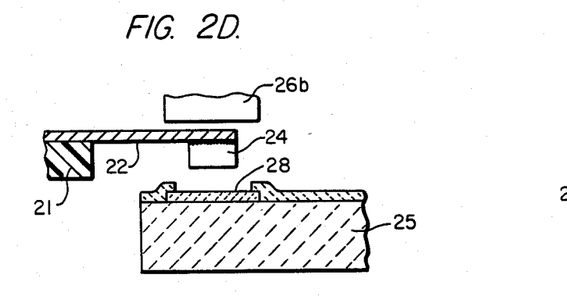

Then, as shown in FIG. 2D, each of the bumps 24 bonded to the metal leads 22 is positioned above a respective aluminum electrode 28 formed on a semiconductor device 25. The interval between the electrodes 28 is similar to that of the bumps 24. Then the bumps 24 are pressed onto the electrode 28 and heated by a tool 26b and thereby the Au of the metal bumps 24 and the aluminum of the electrodes 28 make an alloy at the contacting portion. Since the bump 24 is softer than the lead 22, the pressure is effectively imparted into the bump 24 and the bump is deformed so as to be spread. This gives an advantageous condition for the bonding.

Figure 2E:
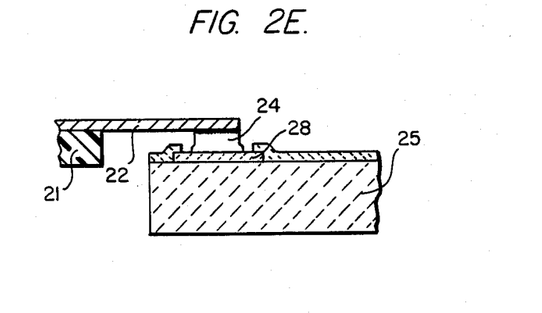

Thus, as shown in FIG. 2E, a strong bonding between the bumps 24 and the electrodes 28 is achieved.

As described above, in the method according to the invention, the metal bumps preparred on the supporting member are connected to the metal leads which are prepared similarly to those in the conventional film carrier method. That is the bumps are transferred from the support member to the leads. Then transferred bumps are easily and strongly bonded, due to the deformation of the bumps, to the electrodes disposed on the semiconductor device.

Although in the above-described example the connection of the metal lead with the metal bump is made by Au—Sn alloy and the metal bump with the electrode by Au—Al alloy, other combinations may be selected for the materials used for the bump and the electrode. For example, if the electrode is composed of Au, it may be preferable to use Sn for the bump and Au for the surface of the metal lead.

At the transfer of the bump from the support to the lead, the bonding may be made by an adhesive which is thermally decomposable. In such case the adhesive will be decomposed at the time of bonding of the bump to the electrode. Thus the lead is directly bonded to the bump by heating at that time.

The effects achieved by the use of the method according to the invention are as follows:

(1) Since only the metal bump is put between the lead and the electrode, there is no peeling off or generation of barrier resistance as in the conventional film carrier method.

Further since the bonding over the whole bonding areas is made by making an alloy, the bonding strength is large and the barrier resistance is kept remarkably small.

(2) In comparison with the conventional film carrier method, the steps for forming the barrier metal such as the deposition step, photolithography step and etching step are eliminated. Therefore the manufacturing is quite simple and so a low cost process is achieved.

(3) The formation of the metal bump in this invention can be performed by plating in such condition that it is only temporarily bonded to a proper support, regardless of the bonding strength. The bonding strength is rather small because the bump is thereafter transferred to the lead. Therefore the bump can quite easily be formed.

Another process to be performed is the pressing and heating, and only a bonding tool is needed for this.

Thus the method according to this invention includes only easy techniques and requires only cheap equipment, which are practically advantageous features.

In the method according to this invention, the transfer of the metal bumps to the metal leads is an important point to be considered. Examples of the formation of the metal bumps are described hereinafter.

Figure 3A:
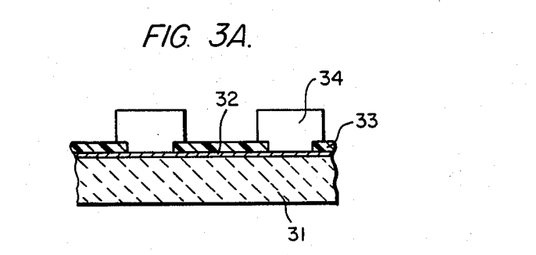
FIGS. 3A and 3B are sectional views showing the steps of forming metal bumps according to this invention.

In FIG. 3A, 31 denotes a support is an insulator substrate or metal substrate which may be polyimide, ceramics, glass, copper, aluminum etc. The configuration thereof may be that of a disc or tape. On the support 31 is deposited a metal layer 32 of a material resembling that of the metal bumps. For example, the support 31 can be a polyimide tape and the metal layer 32 an Au film 500 to 3000 Å in thickness deposited continuously.

Then a photoresist is coated on the metal layer 32 and formed onto a pattern 33 similar to the pattern of electrodes on a semiconductor device with which metal leads are to be connected. Metal bumps 34 of Au are formed to a thickness of 10 to 30 $\mu$m by electroplating, with the photoresist pattern 33 being used as a mask.

Figure 3B:
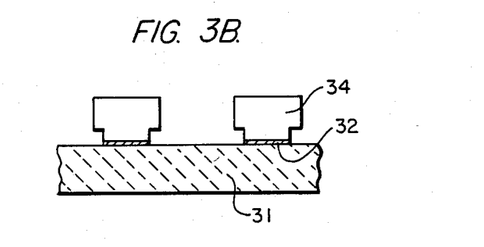

After removing the photoresist pattern 33, the metal layer 32 around the metal bumps 34 is removed, as shown in FIG. 3B.

Thus formed metal bumps 34 are transferred from the support 31 due to the heating and elastic deformation of the support 31, because the bonding strength between the polyimide of the support 31 and the deposited metal layer 32 is small. Since the support 31 is subjected to heat at about 500° C. and a pressure, it is required to have a heat resistance and rigidity to some extent.

Figure 4A:
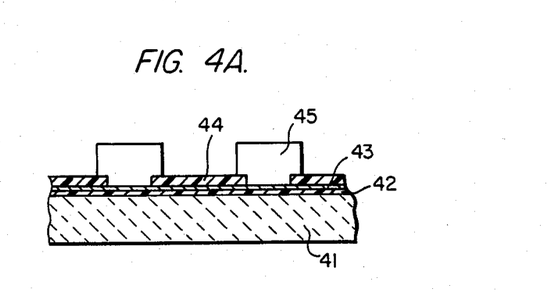
FIGS. 4A and 4B are sectional views showing another embodiment of the steps of forming the metal bumps.
Figure 4B:
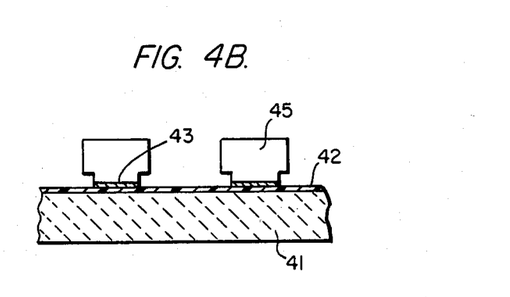

FIGS. 4A and 4B show another structure and production method for the metal bumps. As shown in FIG. 4A, a support 41 is provided with a resin layer 42 and than a metal layer 43 is deposited on the resin layer 42. A photoresist pattern 44 of required configuration is formed on the metal layer 43. Then metal bumps 45 are deposited by, for example, electroplating. Finally the photoresist pattern 44 and the metal layer 43 except the portion beneath the bumps 45 are removed, as shown in FIG. 4B.

In this example the support 41 may be of the same material as that in the example in FIGS. 3A and 3B. The resin layer 42 is made by coating a resin decomposable mostly due to heating, photoresist, polyimide, silicone, epoxy, etc., in a thickness of 100 to 20000 Å. The resin layer 42 is not required to be strongly bonded to the support 41 or the metal layer 43. But it must be such that the resin layer 42 is easily separated from the support 41 at the time of transferring the bump 45 and further leaves hardly any residue on the bottom surface of the bumps 45. The metal layer 43 is made of Au, Ag, Ni, Cu, etc. and deposited in a thickness of about 500 to 10000 Å. After the transfer, it may be left on either the support 41 or the bumps 45. In order to leave the metal layer 43 on the support 41, the metal layer 43 is provided with a material for decreasing the bonding force to the support 41. For example a thin oxide layer having a small electric conductivity may be formed on the surface.

Figure 5A:
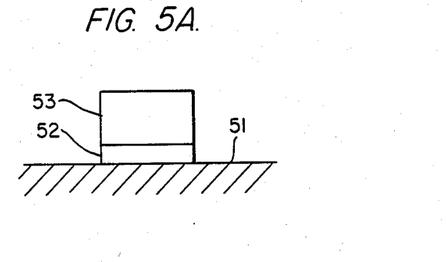
FIGS. 5A and 5B are sectional views illustrating other structures of the metal bump.
Figure 5B:
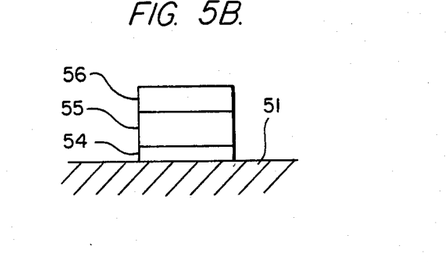

The metal bumps may be multilayer, as shown in FIGS. 5A and 5B. FIG. 5A shows a two-layer bump formed on a support 51, in which 52 denotes a Au layer and 53 a layer of Cu, Ni, Ag, Al, etc. In FIG. 5B, 54 and 56 denotes Au layer and 55 a layer of Cu, Ni, Ag, Al, etc. Such multilayer structure is employed when the bump is made of a material which is difficult to alloy with the material composing the electrode or the lead. Also the multilayer structure is employed so as to make it possible to manufacture the bump at low material-cost by using Au only for limited necessary portions and other cheap metal for the other portions. Namely only the principal portions of the bump, i.e. the portions to be contacted with the metal lead or electrode, are made of Au and the other portion is made of a cheap metal.

As for the elevational configuration of the bump, the under part thereof which is to be contacted with the electrode of the semiconductor device is preferably spherical or tapered so that at an early stage of the pressing and heating step for transfer the pressure is imposed uniformly on the whole portion of the bump, and a metal oxide layer produced naturally on the surface of the electrode of the semiconductor device is removed owing to the pressing by the bump.

Figure 6A:
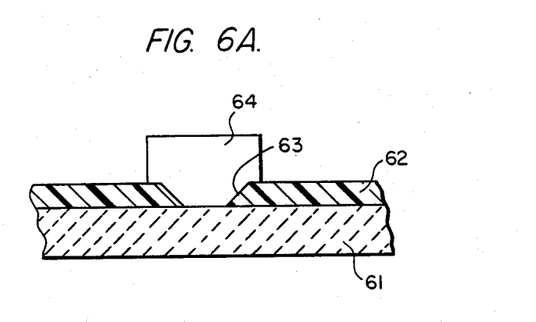
FIGS. 6A and 6B are sectional elevation views illustrating another configuration of the bump and the steps of forming it.
Figure 6B:
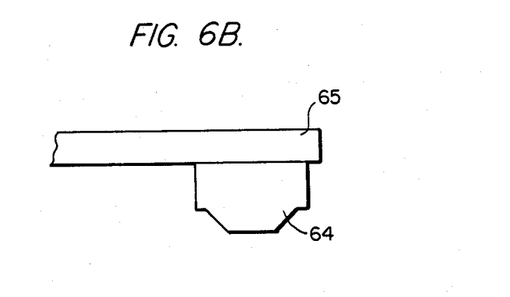

FIGS. 6A and 6B show an example of a bump having a tapered end. Referring to FIG. 6A, on a support 61 is formed a resin pattern 62 having a relatively large thickness. The pattern 62 has a tapered edge 63 at the area where a bump 64 is to be formed. The bump 64 is formed by plating using the pattern 62 as a mask, so that the bottom end portion of the bump 64 is tapered as shown in FIG. 6B. In FIG. 6B, 65 denotes a metal lead. The tapered edge 63 can be made by using a mask pattern having a variation of optical density when forming the resin pattern 62, or by changing the exposure time and controlling the development by utilization of underexposure and overexposure.

Examples of the relative positioning of the lead and the bump are described hereinafter.

Figure 7A:
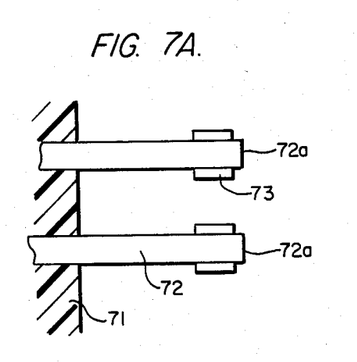
FIGS. 7A to 7C are plan views illustrating plan configurations of the bump.

FIG. 7A shows an example in which metal leads 72 disposed on a polyimide film 71 are bonded to metal bumps 73 in the manner such that the top ends 72a of the leads 72 project beyond the metal bumps 73.

Figure 7B:
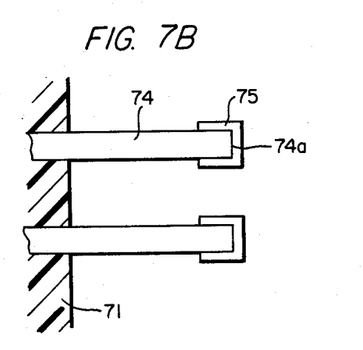

FIG. 7B shows an example in which the top ends 74a of metal leads 74 are positioned within the area of metal bumps 75. In this example, the pressure applied to the leads 74 is imparted in a direction toward the outside of both edges and the end of the lead 74, though in the example of FIG. 7A the pressure is imparted in directions only toward the outside of both edges of the lead 72. Therefore the bonding strength between the lead and bump is easily made large in the example of FIG. 7B.

Figure 7C:
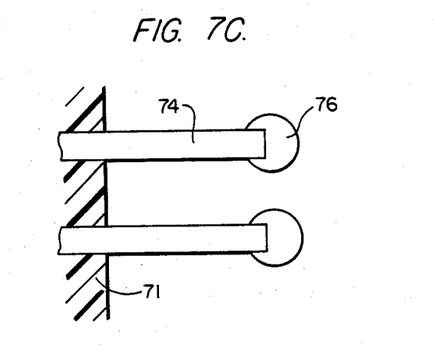

As shown in FIG. 7C, the plan configuration of a bump 76 may be a disk.

A more specific example according to the invention is described hereinafter, referring to FIGS. 2D to 2E.

In this example the semiconductor device 25 is a diode array having a chip size of 1.2 mm×3.4 mm and including thirty-two diodes. The device had sixty-four electrodes 28 of aluminum with a thickness of 1.0 $\mu$m each of which has a terminal, i.e. a region for connection, of 50 $\mu$m×100 $\mu$m in area size. The electrodes 28 are disposed at a 100 $\mu$m pitch.

The metal leads 22 were composed of copper leaves 35 $\mu$m in width and disposed at a 100 $\mu$m pitch. On the leads 22 were deposited an Sn layer of 0.4 $\mu$m thick by electroless plating.

A Si substrate was used for the support 23 and an Au layer of 500 to 1000 Å thick was deposited thereon. On the Au layer were formed the metal bumps 24 of Au with a thickness of 20 $\mu$m by plating.

Then the leads 22 were laid on the bumps 24 on the support and they were pressed and heated by the bonding tool 27a for 0.75 seconds at a temperature of 500° C. and a pressure of 20 psi. Thus the bumps were bonded to the leads by a Au—Sn eutectic alloy and separated from the support.

Figure 8A:
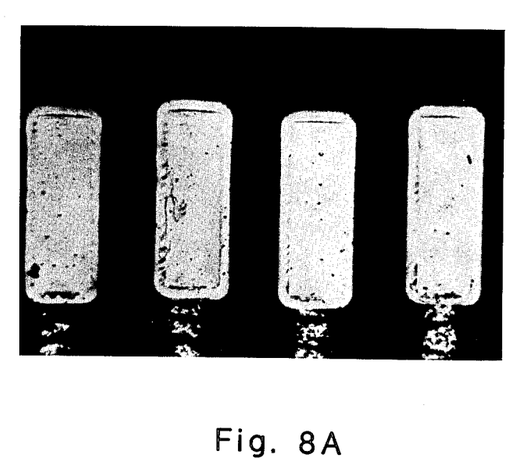
Figure 8B:
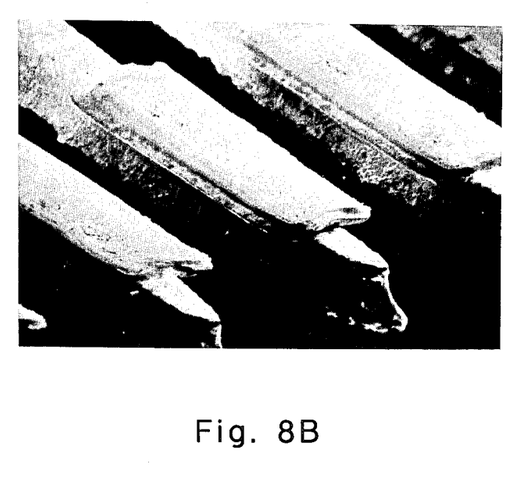

FIG. 8A is a magnified photograph showing in plan an area where the bumps 24 are bonded to the leads 22. SEM analysis of the same is shown perspectively in FIG. 8B.

The bumps 24 bonded to the leads 22 were then laid on the electrodes 28, and pressed and heated by the bonding tool as described above for 1.5 seconds at a temperature of 500° C. at a pressure of 40 psi.

Figure 8C:
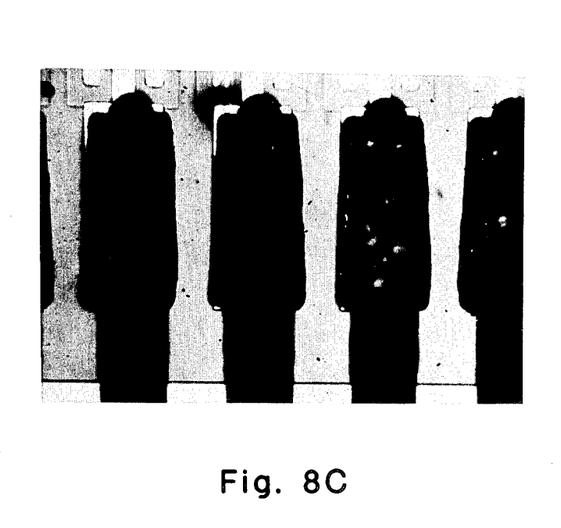
Figure 8D:
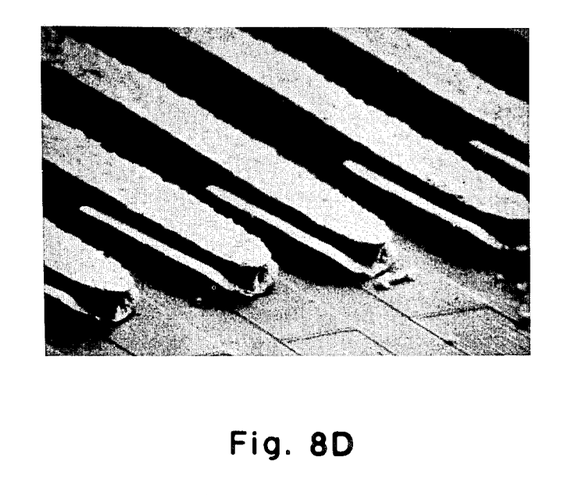

FIG. 8C is a magnified photograph showing in plan an area where the leads 22 are connected to the electrodes 28, with the bumps 24 being interposed therebetween. SEM analysis of the same is perspectively shown in FIG. 8D.

The obtained connection was tested for bonding strength. In the case using a metal lead of 40 to 45 $\mu$m in width, the bonding portion withstood with a force above 15 to 20 g, though the lead was broken.

Another specific example is described hereinafter.

This example is of a semiconductor device having a chip size of 3.4 mm×3.9 mm and sixty-two electrode terminals of a size of 100 $\mu$m×100 $\mu$m. Metal leads were made of the same material as that of the aforementioned example and were disposed at a 200 $\mu$m pitch. Metal bumps were made of Au and manufactured by the method shown in FIG. 4. The size thereof was 60 $\mu$m×60 $\mu$m in area and 15 $\mu$m in height.

Figure 9A:
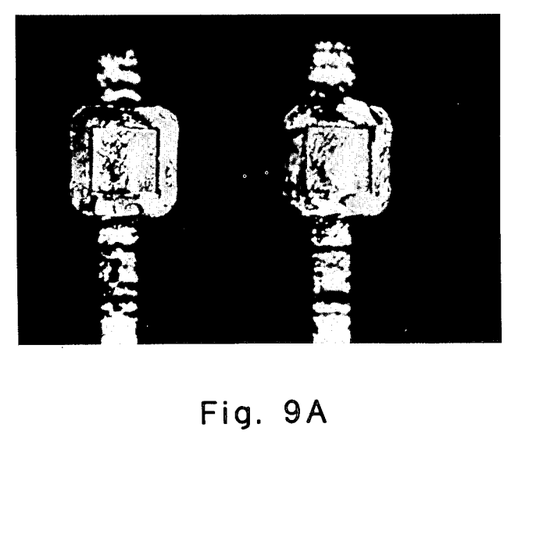
FIGS. 9A and 9B are photographs showing another embodiment of the invention.

The bumps were transferred to the leads by heating for 0.5 seconds at 500° C. at, with a pressure of 25 psi. The bonded state is shown in plan by the magnified photograph of FIG. 9A.

Figure 9B:
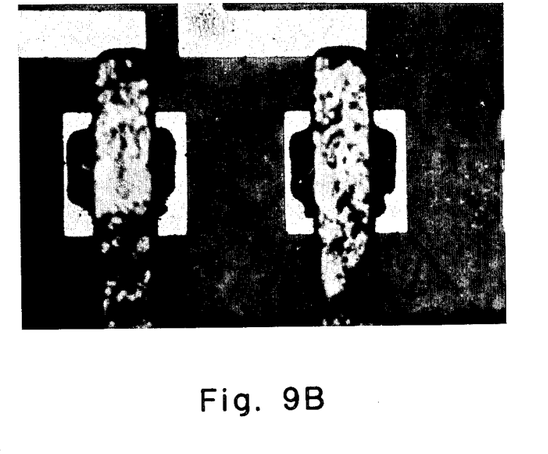

The bonding of the bumps to the semiconductor device is carried out by heating at 475° C. for 1.5 seconds at a pressure of 40 psi. The bonded area is shown in plan in FIG. 9B in the magnified photograph.

Thus the method according to this invention can be easily and effectively used irrespectively of the chip size of the semiconductor device, the size of the electrode, the pitch of disposition of the same or the number of leads.

We claim:

1. A method of connecting metal leads with electrodes of a semiconductor device, comprising the steps of:

forming metal bumps on a supporting member;

aligning metal leads supported on a carrier with said metal bumps and superimposing each of said metal leads on a corresponding one of said bumps;

applying pressure and heat to the surfaces of the respective leads on the opposite side from the surfaces which face said bumps so that the surfaces facing said bumps are pressed against said bumps, the pressure and heat being sufficient for bonding the leads and the bumps and insufficient to produce any substantial melting of the metal of the bumps;

separating said bumps from said support member;

aligning said metal leads with the leads of a semiconductor device so that the surface of each of said metal bumps on the side opposite the surface bonded to said metal lead faces a corresponding one of the electrodes of said semiconductor device; and applying pressure and heat to said metal leads for pressing said metal bumps against said electrodes and bonding them thereto, the pressure and heat being insufficient to produce any substantial melting of the metal of said bumps.

2. A method as claimed in claim 1, in which the metal of said bumps is softer than that of said leads.

3. A method as claimed in claim 1, in which said metal bump is tapered inwardly at the end at which the bump is to be bonded to said electrode.

4. A method as claimed in claim 1, in which said metal bump is wider than said lead body and protrudes beyond the side edges of the lead body.

5. A method as claimed in claim 1, in which said bonding of the leads to the bumps comprises heating the leads and the bumps for forming a eutectic alloy made from the metals of the leads and the bumps.

6. A method as claimed in claim 1, in which said bonding of the leads to the bumps comprises heating the leads and the bumps for producing mutual diffusion of the metals between the leads and the bumps.

7. A method as claimed in claim 1, in which said supporting member for supporting said metal bumps is a plate of a material taken from the group consisting of polyimide, ceramic, glass, copper and aluminum.

8. A method as claimed in claim 1, in which said metal bumps are formed by plating.

9. A method as claimed in claim 1, in which said metal bumps each have a multilayer structure and the outermost layers thereof are composed of materials which are easily bonded by heating to materials of the portion to be connected therewith.

* * * * *